United States Patent
Im et al.

(10) Patent No.: US 7,601,561 B2
(45) Date of Patent: Oct. 13, 2009

(54) HEAT-RADIATING TAPE CARRIER PACKAGE AND METHOD FOR MANUFACTURING THE SAME

(75) Inventors: Yun-Hyeok Im, Yongin-si (KR);
Dong-Han Kim, Osan-si (KR);
Jae-Wook Yoo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 510 days.

(21) Appl. No.: 11/585,962

(22) Filed: Oct. 25, 2006

(65) Prior Publication Data

US 2007/0216016 A1    Sep. 20, 2007

(30) Foreign Application Priority Data

Mar. 20, 2006    (KR)   ................ 10-2006-0025166

(51) Int. Cl.
*H01L 21/44*    (2006.01)
*H01L 29/40*    (2006.01)
*H01L 23/29*    (2006.01)

(52) U.S. Cl. ...................................... 438/109; 257/777

(58) Field of Classification Search ................ 257/676, 257/686, 777, 778; 438/107–109
See application file for complete search history.

(56) References Cited

U.S. PATENT DOCUMENTS 6,022,759 A *   2/2000   Seki et al. ................. 438/123
6,646,335 B2 *   11/2003   Emoto ...................... 257/686

FOREIGN PATENT DOCUMENTS

| JP | 11-127275 | * | 5/1999 |
| JP | 2000-323627 | | 11/2000 |
| JP | 2001-118949 | | 4/2001 |
| KR | 2005-38940 | | 4/2005 |

* cited by examiner

*Primary Examiner*—Calvin Lee
(74) *Attorney, Agent, or Firm*—Harness, Dickey & Pierce, P.L.C.

(57) ABSTRACT

A tape carrier package may include an interposer having a first surface and a second surface. The first surface of the interposer may be attached to an exposed active surface of a semiconductor chip. A heat sink may be attached to the second surface of the interposer.

23 Claims, 5 Drawing Sheets

HEAT-RADIATING TAPE CARRIER PACKAGE AND METHOD FOR MANUFACTURING THE SAME

PRIORITY STATEMENT

This U.S. non-provisional application claims benefit of priority under 35 U.S.C. §119 from Korean Patent Application No. 2006-25166, filed on Mar. 20, 2006 in the Korean Intellectual Property Office, the entire contents of which are incorporated herein by reference.

BACKGROUND

1. Field of the Invention

Example embodiments of the present invention relate generally to a tape package technique and, more particularly, to a heat-radiating tape carrier package and method for manufacturing the heat-radiating tape carrier package.

2. Discussion of the Related Art

With the development of the flat panel display industry, for example LCD for portable phones, TFT LCD for computers and PDP for domestic use, there may be a developing trend to use tape packages as a component of flat display devices.

The tape packages may include, for example, tape carrier packages (TCPs) and chip on film (COF) packages. The TCPs may include a tape wiring substrate having a window and a semiconductor chip may be mounted on the tape wiring substrate using an inner lead bonding (ILB) method, for example. The COF packages may include a solid tape wiring substrate and a semiconductor chip may be mounted on the tape wiring substrate using a flip chip bonding method.

FIG. 1 is a cross-sectional view of a conventional tape carrier package 100.

Referring to FIG. 1, the tape carrier package 100 may include a tape wiring substrate 20 having a window 22, and a semiconductor chip 10 may be inner lead-bonded to the tape wiring substrate 20. For example, inner leads 24 of the tape wiring substrate 20 may be connected to chip bumps 13 of the semiconductor chip 10. An encapsulant 30 may seal the inner lead-bonded portions between the semiconductor chip 10 and the tape wiring substrate 20. The semiconductor chip 10 may have an active surface and a back surface. Chip pads 11 may be arranged at a peripheral region of the active surface of the semiconductor chip 10. The chip bumps 13 may be provided on the chip pads 11. Cells (not shown) may be arranged at a central region of the active surface of the semiconductor chip 10.

During operation of the tape carrier package 100, a hot spot may occur in the central region of the active surface of the semiconductor chip 10 where the cells are provided. As power required for operation of the tape carrier package 100 increases, the hot spot phenomenon may become increasingly severe.

To radiate heat generated from the central region of the semiconductor chip 10, the tape carrier package 100 may have a heat sink 60 and/or a housing 70.

The heat sink 60 may be attached to the encapsulant 30 having low heat conductivity, which may result in ineffective heat radiation. In some instances, an air space 40 may be formed between the semiconductor chip 10 and the heat sink 60.

For example, when the tape carrier package 100 operates at an environmental temperature of about 25° C. and power of about 4.7 W, the temperature of the semiconductor chip 10 may be about 68° C. The high temperature of the semiconductor chip 10 may result in deteriorated operating characteristics and/or a reduced life of the semiconductor chip 10.

SUMMARY

Example embodiments of the present invention may provide a tape carrier package with improved heat radiation, for example.

According to an example embodiment of the present invention, a tape carrier package may include a semiconductor chip having an active surface and a back surface. A plurality of chip pads may be provided on the active surface. A plurality of chip bumps may be provided on the chip pads. A tape wiring substrate may include a base film having a window through which the active surface of the semiconductor chip may be exposed. Wiring patterns may be formed on the base film. The wiring patterns may include inner leads that may be bonded to the chip bumps of the semiconductor chip. An interposer may have a first surface attached to the active surface of the semiconductor chip and a second surface opposite to the first surface. A heat sink may be attached to the second surface of the interposer.

According to an example embodiment of the present invention, the interposer may be formed from one of Si and a phase change material.

According to an example embodiment of the present invention, the interposer may be formed of at least one bar.

According to an example embodiment of the present invention, the tape carrier package may further include an encapsulant sealing the bonded portions between the semiconductor chip and the tape wiring substrate.

According to an example embodiment of the present invention, the height of the encapsulant above the active surface of the semiconductor chip may be equal to or smaller than the height of the interposer.

According to an example embodiment of the present invention, the tape carrier package may further include a housing attached to the back surface of the semiconductor chip.

According to another example embodiment of the present invention, a method for manufacturing a tape carrier package may involve inner lead-bonding a semiconductor element having an active surface to a tape wiring substrate having a window. The semiconductor element may be a semiconductor chip. A first surface of an interposer may be attached to the active surface of the semiconductor chip through the window so that the interposer may be located in the window of the tape wiring substrate. A heat sink may be attached to a second surface of the interposer.

According to an example embodiment of the present invention, the interposer may be formed from one of Si and a phase change material.

According to an example embodiment of the present invention, the interposer may be formed of at least one bar.

According to an example embodiment of the present invention, the method may further include forming an encapsulant sealing the bonded portions between the semiconductor chip and the tape wiring substrate.

According to an example embodiment of the present invention, the method may further include applying an epoxy molding compound to the bonded portions between the semiconductor chip and the tape wiring substrate.

According to an example embodiment of the present invention, the interposer may be attached to a central region of the active surface of the semiconductor chip through the epoxy molding compound.

According to an example embodiment of the present invention, the method may further include forming an encapsulant using the epoxy molding compound for sealing the bonded portions between the semiconductor chip and the tape wiring substrate.

According to an example embodiment of the present invention, the method may further include attaching a housing to a back surface of the semiconductor chip.

According to another example embodiment of the present invention, a method for manufacturing a tape carrier package may involve attaching a first surface of an interposer to an active surface of a semiconductor element. The semiconductor element may be a wafer including a plurality of semiconductor chips. The semiconductor chips may be separated from the wafer. The semiconductor chip may be inner lead-bonded to a tape wiring substrate such that the interposer is located in a window of the tape wiring substrate. A heat sink may be attached to a second surface of the interposer.

According to an example embodiment of the present invention, the method may further include forming an encapsulant sealing the bonded portions between the semiconductor chip and the tape wiring substrate.

According to an example embodiment of the present invention, the method may further include attaching a housing to a back surface of the semiconductor chip.

BRIEF DESCRIPTION OF THE DRAWINGS

Example, non-limiting embodiments of the present invention will be readily understood with reference to the following detailed description thereof provided in conjunction with the accompanying drawings, wherein like reference numerals designate like structural elements.

The drawings are for illustrative purposes only and are not drawn to scale. The spatial relationships and relative sizing of the elements illustrated in the various embodiments may have been reduced, expanded and/or rearranged to improve the clarity of the figures with respect to the corresponding description. The figures, therefore, should not be interpreted as accurately reflecting the relative sizing and/or positioning of the corresponding structural elements that could be encompassed by an actual device manufactured according to the example embodiments of the invention.

DESCRIPTION OF EXAMPLE NON-LIMITING EMBODIMENTS

Example, non-limiting embodiments of the present invention will now be described more fully hereinafter with reference to the accompanying drawings. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

It should be noted that the figures are intended to illustrate the general characteristics of methods and devices of example embodiments of this invention, for the purpose of the description of such example embodiments herein. These drawings are not, however, to scale and may not precisely reflect the characteristics of any given embodiment, and should not be interpreted as defining or limiting the range of values or properties of example embodiments within the scope of this invention. Rather, for simplicity and clarity of illustration, the dimensions of some of the elements may be exaggerated relative to other elements.

Well-known structures and processes are not described or illustrated in detail to avoid obscuring the present invention.

An element is considered as being mounted (or provided) "on" another element when mounted or provided) either directly on the referenced element or mounted (or provided) on other elements overlaying the referenced element. Throughout this disclosure, spatial terms such as "upper," "lower," "above" and "below" (for example) are used for convenience in describing various elements or portions or regions of the elements as shown in the figures. These terms do not, however, require that the structure be maintained in any particular orientation.

Figure 1:
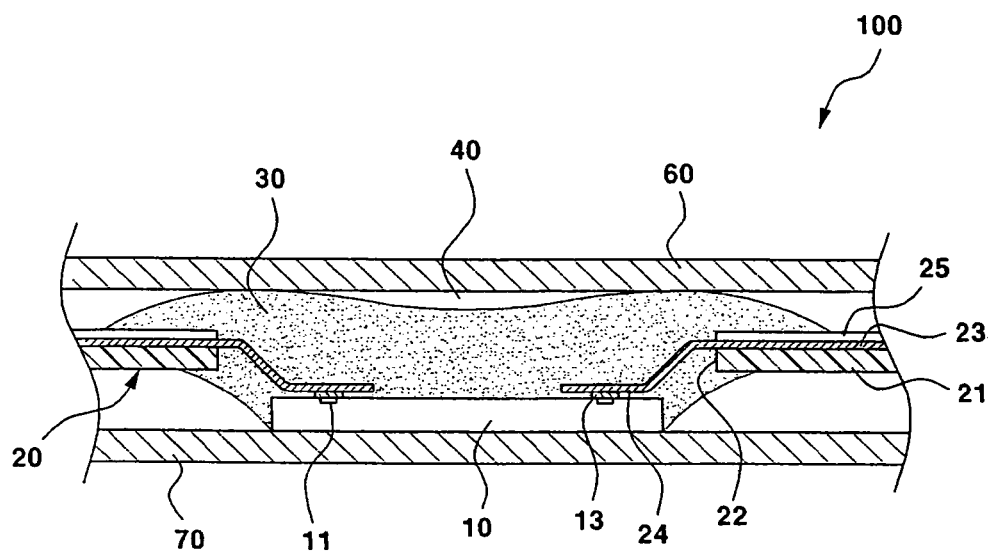
FIG. 1 is a cross-sectional view of a conventional tape carrier package.
Figure 2:
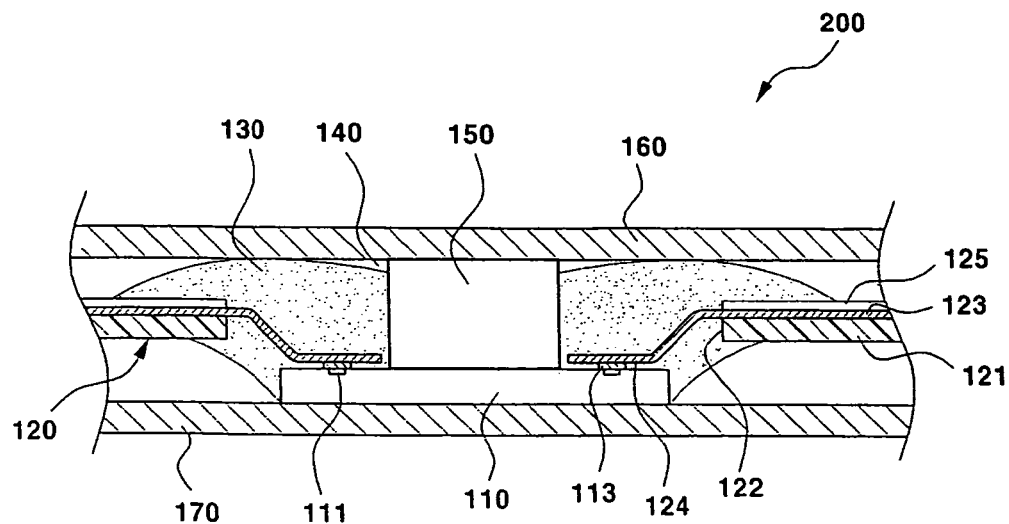
FIG. 2 is a cross-sectional view of a tape carrier package in accordance with an example embodiment of the present invention.

FIG. 2 is a cross-sectional view of a tape carrier package 200 in accordance with an example embodiment of the present invention.

Referring to FIG. 2, the tape carrier package 200 may include a tape wiring substrate 120 and a semiconductor chip 110 bonded to the tape wiring substrate 120. An encapsulant 130 may seal the bonded portions between the semiconductor chip 110 and the tape wiring substrate 120. An interposer 150 may be attached to an active surface of the semiconductor chip 110. A heat sink 160 may be attached to the interposer 150. A housing 170 may be attached to a back surface of the semiconductor chip 110.

The semiconductor chip 110 may have a plurality of chip pads 111 and a plurality of chip bumps 113. By way of example only, the chip pads 111 may be arranged at a peripheral region of the active surface of the semiconductor chip 110. The chip bumps 113 may be provided on the chip pads 111. The chip bump 113 may be formed from metals, for example Au, Cu, Ni and/or solder.

The tape wiring substrate 120 may comprise a base film 121, wiring patterns 123 and a protection layer 125.

The base film 121 may have a window 122, through which a central region of the active surface of the semiconductor chip 110 may be exposed. By way of example only, the base film 121 may be formed from an insulating synthetic resin having flexibility, such as a polyimide resin.

The wiring patterns 123 may overlie an upper surface of the base film 121 and extend from the base film 121. The wiring patterns 123 may include inner leads 124 formed at one end and outer leads (not shown) formed at the other end. The inner lead 124 may extend into the window 122 and be connected to the chip bump 113 of the semiconductor chip 110. The outer lead may be configured to connect the semiconductor chip 110 to an external system. The wiring pattern 123 may be formed from materials having good electrical conductivity, for example Cu, Ni, Au, solder or an alloy thereof.

The protection layer 125 may be provided on the upper surface of the base film 121 including the wiring patterns 123, and may be configured to protect the wiring patterns 123. The inner lead 124 and the outer lead may be exposed from the protection layer 125. The protection layer 125 may be formed from solder resist, for example.

The encapsulant 130 may seal the inner lead-bonded portions between the semiconductor chip 110 and the tape wiring substrate 120. The encapsulant 130 may be formed on the active surface of the semiconductor chip 110 using a molding compound.

By way of example only, the interposer 150 may be a single bar of material having a first surface and a second surface. The interposer 150 may be embedded in the encapsulant 130 such that the first surface may be attached to the central region of the active surface of the semiconductor chip 110 and the second surface may be exposed from the encapsulant 130. The interposer 150 may transmit heat from the semiconductor chip 110 to the heat sink 160. The interposer 150 may be formed from materials having high heat conductivity, for example Si and/or a thermal interface material such as a phase change material. The shape of the interposer 150 may vary. As shown, the interposer 150 may have a cross-sectional profile in the shape of a square. In alternative embodiments, the interposer 150 may have a cross-sectional profile of any geometric shape. Further, the interposer 150 may be located on regions of the active surface other than the central region.

The heat sink 160 may be attached to the exposed second surface of the interposer 150 and be configured to radiate heat transmitted from the interposer 150 to the external environment. The heat sink 160 may be formed from materials having good heat conductivity. Such materials may include, for example, metals selected from one of Ni, Au, Ag, Sn and/or Cr, which may be coated on metals selected from one of Cu, Al, CuW, AlSiC, AlN and/or BeO.

The interposer 150 may reduce the likelihood that an air space 140 between the semiconductor chip 110 and the heat sink 160 may reduce heat radiation of the heat sink 160.

The housing 170 may be attached to the back surface of the semiconductor chip 110 and be configured to radiate heat from the semiconductor chip 110. The housing 170 may directly contact the semiconductor chip 110, which may eliminate a separate medium between the semiconductor chip 110 and the housing 170.

Heat generated from the semiconductor chip 110 may be radiated by the heat sink 160 through the interposer 150 and/or by the housing 170 directly.

For example, when the tape carrier package 200 operates in an environmental temperature of 25° C. and a power of about 4.7 W, the temperature of the semiconductor chip 110 may be about 49° C.

Figure 3A:
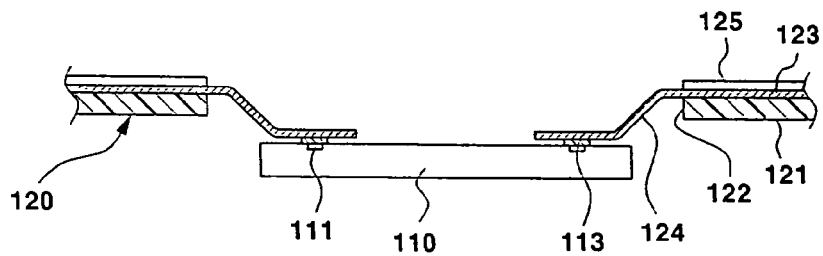
FIGS. 3A to 3C are schematic views of a method that may be implemented to manufacture the tape carrier package of FIG. 2 in accordance with an example embodiment of the present invention.
Figure 3B:
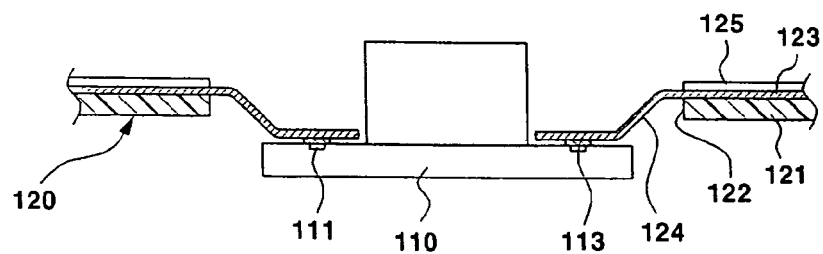
Figure 3C:
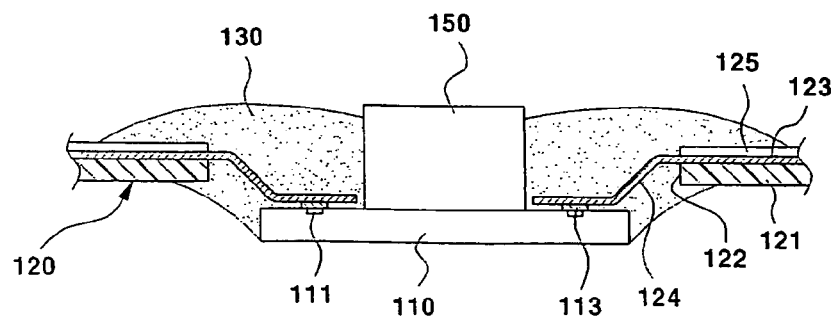

FIGS. 3A to 3C are schematic views of a method that may be implemented to manufacture the tape carrier package 200 of FIG. 2 in accordance with an example embodiment of the present invention.

Referring to FIG. 3A, the semiconductor chip 110 may be bonded to the tape wiring substrate 120. For example, the tape wiring substrate 120 may be aligned with the semiconductor chip 110 such that a window of the tape wiring substrate 120 may correspond to an active surface of the semiconductor chip 110. By way of example only, the semiconductor chip 110 may be inner lead-bonded to the tape wiring substrate 120 such that chip bumps 113 of the semiconductor chip 110 may be connected to inner leads 124 of the tape wiring substrate 120.

Referring to FIG. 3B, an interposer 150 may be attached to the semiconductor chip 110. For example, the interposer 150 may be formed of a single bar having a first surface and a second surface. The first surface of the interposer 150 may be attached to a central region of the active surface of the semiconductor chip 110 using an adhesive. The adhesive may include a thermal conductive adhesive, for example a thermal grease.

Referring to FIG. 3C, an encapsulant 130 may be formed. For example, an epoxy molding compound may be attached to the inner lead-bonded portions between the semiconductor chip 110 and the tape wiring substrate 120, and be cured. The height of the encapsulant 130 above the active surface of the semiconductor chip 110 may be equal to or smaller than the height of the interposer 150. The second surface of the interposer 150 may be exposed from the encapsulant 130.

Returning to FIG. 2, a heat sink 160 and a housing 170 may be attached. For example, the heat sink 160 may be attached to the exposed second surface of the interposer 150 using an adhesive, and the housing 170 may be attached to a back surface of the semiconductor chip 110 using an adhesive. The adhesive may include a thermal conductive adhesive, for example a thermal grease.

Figure 4A:
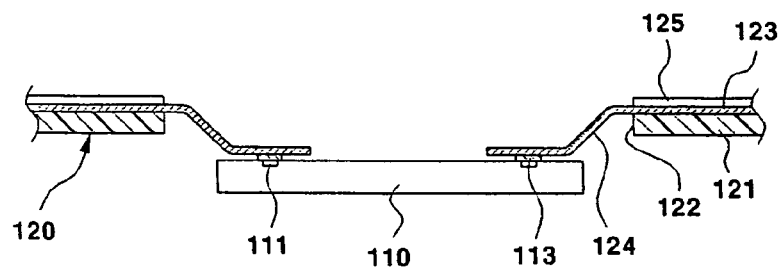
FIGS. 4A to 4C are schematic views of a method that may be implemented to manufacture the tape carrier package of FIG. 2 in accordance with another example embodiment of the present invention.
Figure 4B:
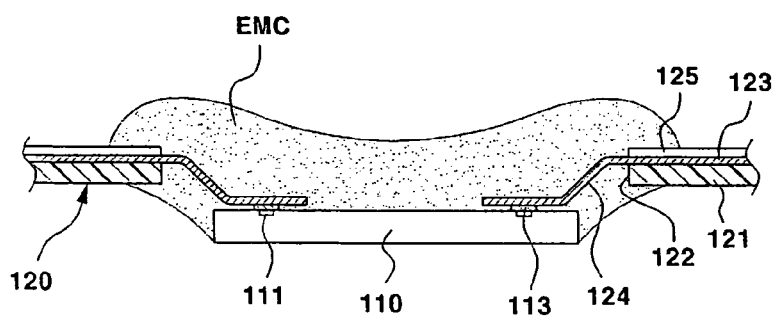
Figure 4C:
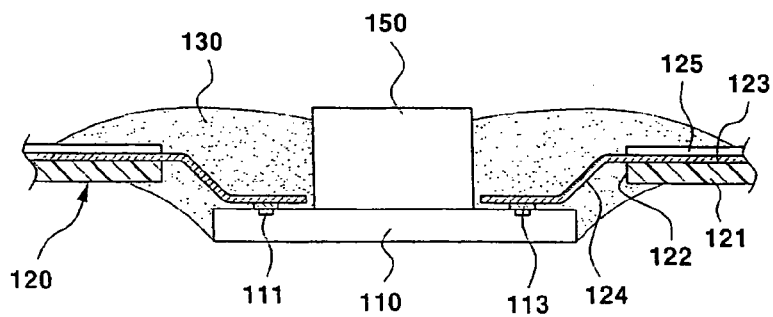

FIGS. 4A to 4C are schematic views of a method that may be implemented to manufacture the tape carrier package 200 of FIG. 2 in accordance with another example embodiment of the present invention.

Referring to FIG. 4A, the semiconductor chip 110 may be inner lead-bonded to the tape wiring substrate 120.

Referring to FIG. 4B, an epoxy molding compound may be applied to the inner lead-bonded portions between the semiconductor chip 110 and the tape wiring substrate 120. The epoxy molding compound may have a predetermined viscosity and serve as an adhesive.

Referring to FIG. 4C, an interposer 150 and an encapsulant 130 may be formed. For example, a first surface of the interposer 150 may be attached to a central region of an active surface of the semiconductor chip 110 through the epoxy molding compound. The epoxy molding compound may serve as an adhesive between the semiconductor chip 110 and the interposer 150. The epoxy molding compound may be cured to form the encapsulant 130.

Returning to FIG. 2, a heat sink 160 and a housing 170 may be attached.

Figure 5A:
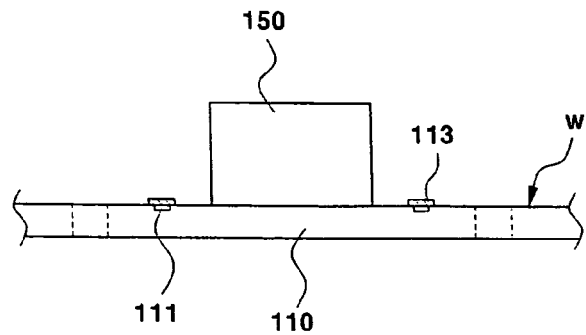
FIGS. 5A to 5C are schematic views of a method that may be implemented to manufacture the tape carrier package of FIG. 2 in accordance with another example embodiment of the present invention.
Figure 5B:
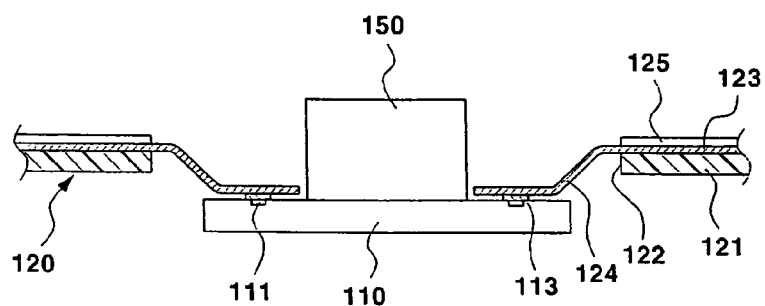
Figure 5C:
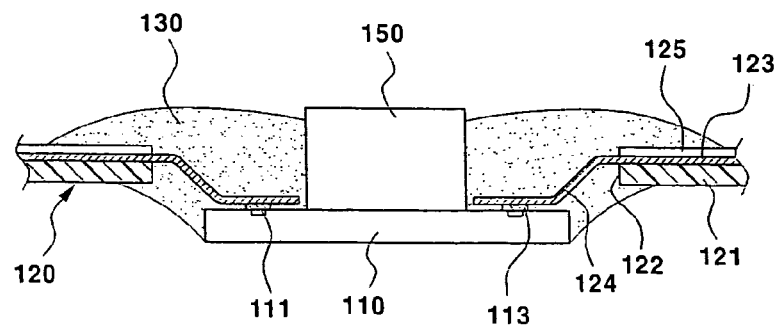

FIGS. 5A to 5C are schematic views of a method that may be implemented to manufacture the tape carrier package 200 of FIG. 2 in accordance with another example embodiment of the present invention.

Referring to FIG. 5A, the interposer 150 may be attached to an active surface of a wafer (W) including a plurality of semiconductor chips 110 using an adhesive. Each of the semiconductor chips 110 may have a respective interposer 150 formed on a central region of an active surface thereof. The adhesive may include a thermal conductive adhesive, for example a thermal grease.

Referring to FIG. 5B, the semiconductor chip 110 may be bonded to a tape wiring substrate 120. For example, the semiconductor chips 110 may be separated from the wafer (W). The semiconductor chip 110 may be aligned with the tape wiring substrate 120 such that the interposer 150 may be located in a window 122 of the tape wiring substrate 120. The semiconductor chip 110 may be mounted on the tape wiring substrate 120 such that chip bumps 113 of the semiconductor chip 110 may be connected to inner leads 124 of the tape wiring substrate 120.

Referring to FIG. 5C, an encapsulant 130 may be formed. For example, an epoxy molding compound may be applied to the inner lead-bonded portions between the semiconductor chip 110 and the tape wiring substrate 120, and be cured.

Returning to FIG. 2, a heat sink 160 and a housing 170 may be attached.

Figure 6:
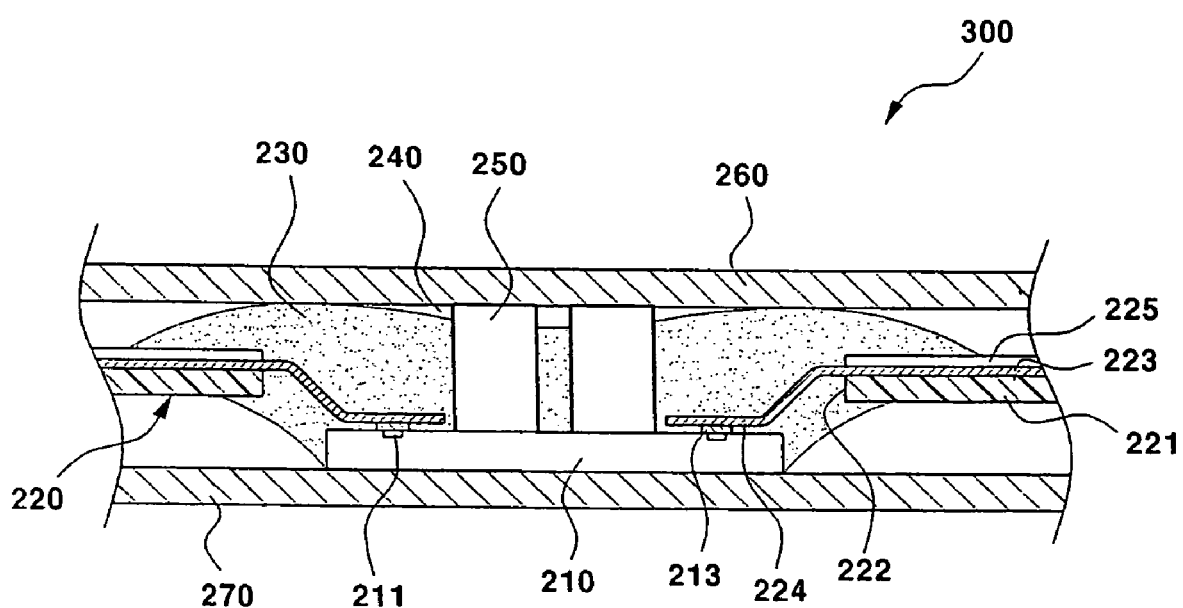
FIG. 6 is a cross-sectional view of a tape carrier package in accordance with another example embodiment of the present invention.

FIG. 6 is a cross-sectional view of a tape carrier package 300 in accordance with another example embodiment of the present invention.

Referring to FIG. 6, the tape carrier package 300 of this example embodiment may have a configuration similar to that as the tape carrier package 200 of the previous embodiment. Here, however, the interposer 250 may include a plurality of bars. By way of example only, the plurality of bars may be arranged in a grid array.

The interposer 250 may have a first surface attached to a central region of an active surface of a semiconductor chip 210 and a second surface attached to a heat sink 260. A housing 270 may be attached to a back surface of the semiconductor chip 210. Therefore, heat generated from the semiconductor chip 210 may be radiated by the heat sink 260 through the interposer 250 and/or the housing 270 directly.

Although example, non-limiting embodiments of the present invention have been described in detail hereinabove, it should be understood that many variations and/or modifications of the basic inventive concepts taught herein, which may appear to those skilled in the art, will still fall within the spirit and scope of the invention as defined by the appended claims.

What is claimed is:

1. A method for manufacturing a tape carrier package comprising:
    inner lead bonding a semiconductor element having an active surface to a tape wiring substrate having a window;
    attaching a first surface of an interposer to the active surface of the semiconductor element through the window; and
    attaching a heat sink to a second surface of the interposer.

2. The method of claim 1, wherein the semiconductor element is a semiconductor chip.

3. The method of claim 2, wherein the interposer is formed from one of Si and a phase change material.

4. The method of claim 2, wherein the interposer is formed of at least one bar.

5. The method of claim 2, further comprising forming an encapsulant sealing the bonded portions between the semiconductor chip and the tape wiring substrate.

6. The method of claim 5, wherein the height of the encapsulant above the active surface of the semiconductor chip is equal to or smaller than the height of the interposer.

7. The method of claim 2, further comprising attaching a housing to a back surface of the semiconductor chip.

8. The method of claim 2, further comprising applying an epoxy molding compound to the bonded portions between the semiconductor chip and the tape wiring substrate.

9. The method of claim 8, wherein the interposer is attached to a central region of the active surface of the semiconductor chip through the epoxy molding compound.

10. The method of claim 8, further comprising forming an encapsulant using the epoxy molding compound for sealing the bonded portions between the semiconductor chip and the tape wiring substrate.

11. The method of claim 10, wherein the height of the encapsulant above the active surface of the semiconductor chip is equal to or smaller than the height of the interposer.

12. The method of claim 1, wherein the semiconductor element is a wafer including a plurality of semiconductor chips, further comprising:
    separating the semiconductor chips from the wafer.

13. The method of claim 12, wherein the interposer is formed from one of Si and a phase change material.

14. The method of claim 12, wherein the interposer is formed of at least one bar.

15. The method of claim 12, further comprising forming an encapsulant sealing the bonded portions between the semiconductor chip and the tape wiring substrate.

16. The method of claim 15, wherein the height of the encapsulant above the active surface of the semiconductor chip is equal to or smaller than the height of the interposer.

17. The method of claim 12, further comprising attaching a housing to a back surface of the semiconductor chip.

18. A tape carrier package comprising:
    a semiconductor chip having an active surface and a back surface, the semiconductor chip having a plurality of chip pads provided on the active surface and a plurality of chip bumps formed on the chip pads; and
    a tape wiring substrate including a base film having a window, through which the active surface of the semiconductor chip is exposed, and wiring patterns formed on the base film, the wiring patterns including inner leads bonded to the chip bumps;
    an interposer having a first surface attached to the active surface of the semiconductor chip and a second surface opposite to the first surface; and
    a heat sink attached to the second surface of the interposer.

19. The tape carrier package of claim 18, wherein the interposer is formed from one of Si and a phase change material.

20. The tape carrier package of claim 18, wherein the interposer is formed of at least one bar.

21. The tape carrier package of claim 18, further comprising an encapsulant sealing the bonded portions between the semiconductor chip and the tape carrier package.

22. The tape carrier package of claim 21, wherein the height of the encapsulant above the active surface of the semiconductor chip is equal to or smaller than the height of the interposer.

23. The tape carrier package of claim 18, further comprising a housing attached to the back surface of the semiconductor chip.

* * * * *